(12) United States Patent
Tomokage

(10) Patent No.: US 7,911,219 B2
(45) Date of Patent: Mar. 22, 2011

(54) WIRING PATTERN CHARACTERISTIC EVALUATION MOUNTING BOARD

(75) Inventor: Hajime Tomokage, Fukuoka (JP)

(73) Assignee: Fukuoka Industry, Science & Technology Foundation, Fukuoka (JP)

( * ) Notice: Subject to any disclaimer, the term of this patent is extended or adjusted under 35 U.S.C. 154(b) by 250 days.

(21) Appl. No.: 12/084,582

(22) PCT Filed: Nov. 30, 2005

(86) PCT No.: PCT/JP2006/323960
§ 371 (c)(1),
(2), (4) Date: Jun. 2, 2008

(87) PCT Pub. No.: WO2007/063949
PCT Pub. Date: Jun. 7, 2007

(65) Prior Publication Data
US 2009/0128179 A1 May 21, 2009

(30) Foreign Application Priority Data
Nov. 30, 2005 (JP) .................................. 2005-346863

(51) Int. Cl.
*G01R 31/26* (2006.01)

(52) U.S. Cl. ................................................. 324/762.01
(58) Field of Classification Search ................... 324/537
See application file for complete search history.

(56) References Cited

FOREIGN PATENT DOCUMENTS

| JP | 03-033665 A | 2/1991 |
|---|---|---|
| JP | 04-179183 A | 6/1992 |
| JP | 2003-050256 A | 2/2003 |

OTHER PUBLICATIONS

International Search Report (Form PCT/ISA/210); International Application No. PCT/JP2006/323960; International Search Report Date: Feb. 7, 2007.

*Primary Examiner* — Ha Tran T Nguyen
*Assistant Examiner* — Roberto Velez
(74) *Attorney, Agent, or Firm* — Rader, Fishman & Grauer PLLC (57) ABSTRACT

Wiring pattern characteristic evaluation mounting boards in which characteristics of wiring patterns formed on the mounting boards are previously evaluated when the mounting boards are manufactured in mass-production, and more particularly relates to such wiring pattern characteristic evaluation mounting boards in which characteristics of wiring patterns to a high frequency pulse signal or a high speed pulse signal are evaluated.

6 Claims, 9 Drawing Sheets

BACKGROUND OF ART

FIG.9

WIRING PATTERN CHARACTERISTIC EVALUATION MOUNTING BOARD

TECHNICAL FIELD

The present invention relates to wiring pattern characteristic evaluation mounting boards in which characteristics of wiring patterns formed on the mounting boards are previously evaluated when the mounting boards are manufactured in mass-production, and more particularly relates to such wiring pattern characteristic evaluation mounting boards in which characteristics of wiring patterns to a high frequency pulse signal or a high speed pulse signal are evaluated.

BACKGROUND OF ART

Figure 9:
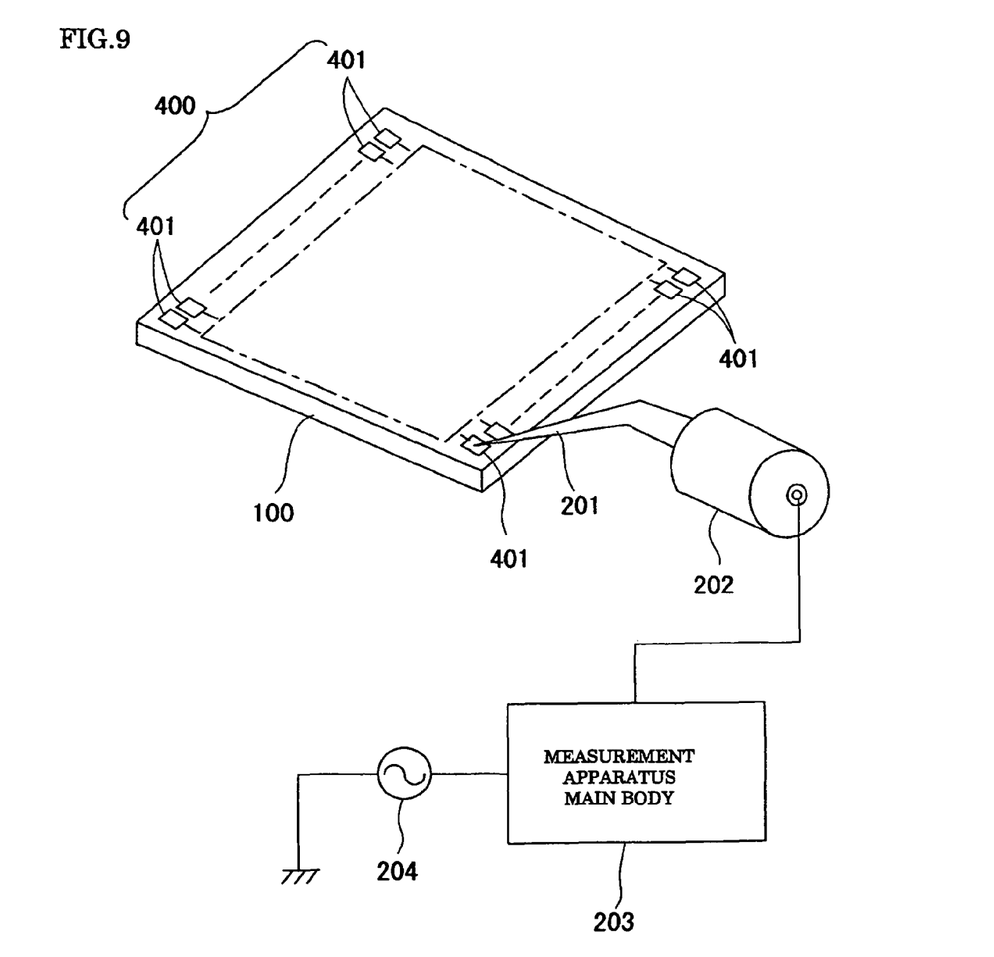
[FIG. 9] is an operation-explanatory view of an characteristic evaluation of a conventional trial-produced mounting board and a conventional test wiring pattern board.

Conventionally, for evaluating a characteristic of a high frequency signal with respect to a board or a mounting board of this type, there are two cases using a test mounting board on which electronic parts and so on are mounted and a test wiring pattern board on which only wiring patterns are formed, respectively. An operation explanation of characteristic evaluation for both the trial-produced mounting board and the test wiring pattern board is shown in FIG. 9.

In the case where the aforesaid trial-produced mounting board is used, a wiring pattern similar to that on a mass-production board are designed by a designer, and the designed wiring pattern 410 is formed on a board 100. Then, electronic parts such as IC's, LSI's and so on (not shown) are mounted on the board 100 on which the wiring pattern 410 is formed, resulting in manufacture of the trial-produced mounting board.

In the trial-produced mounting board thus produced, a test signal, which is a high frequency pulse signal or a high speed pulse signal, is transmitted from a test signal outputting section 202 to the wiring pattern 410 through a pad 401 on the board 100, a detection signal based on the transmitted test signal, which is a high frequency signal or a high speed pulse signal, is output from the wiring pattern 410 to a measurement apparatus main body 203 through the pad 401 and a probe 201, and thus an operational test is carried out by performing an evaluation with respect to the high frequency signal on the board 100 with the measurement apparatus main body 203. On the based on these test results, a fresh test mounting board is manufactured, and try and error are repeated until transmission of the high frequency signal or the high speed pulse signal are can be correctly carried out, whereby a trial-produced mounting board, which may be regarded as a mass-production board, is manufactured.

Also, in the case where the test wiring pattern board is used, a wiring pattern 410 including wire lines, through holes and so on is formed on a board 100, and pads 401 are formed to input a test signal, which is a high frequency signal or a high speed pulse signal, to the wiring pattern 410, resulting in manufacture of the test wiring pattern board. A probe 201 of a testing apparatus is contacted with a pad 401 on the test wiring pattern board to thereby carry out a characteristic evaluation on the wiring pattern 410. With this testing apparatus, a test signal, which is a high frequency signal or a high speed pulse signal, is transmitted from the pad 401 to the aforesaid wiring pattern 410 through the probe 201, a detection signal based on the transmitted test signal, which is a high frequency signal or a high speed pulse signal, is output from the wiring pattern 410 to a measurement apparatus main body 203 through the pad 401 and the probe 201, and thus an operational test is carried out to determine whether or not a transmission can be properly achieved by performing an evaluation with respect to the high frequency signal on the board 100 with the measurement apparatus main body 203.

DISCLOSURE OF THE INVENTION

Problems to be Resolved by the Invention

Among the conventional characteristic evaluation mounting boards for a high frequency signal, in the case of the trial-produced mounting board, due to the fact that a test mounting board, which is equivalent to a mass-production board, is manufactured in a try and error manner, it takes a long time in a design and a manufactured to obtain a test mounting board which may be regarded as a mass-production, and thus there is a problem that a manufacture cost of a plurality of test mounting boards is plural times larger than that of a mass-production board.

Also, in either of the cases where the aforesaid test mounting board and the aforesaid test wiring pattern board are used, there is a problem that a signal loss and a noise occur in a contact location of the probe 201 due to the facts that a calibration is involved in the probe 201 which is contacted with a pad 401 formed on the board 100, and that signal transmission rates and electrical current rates are individually different in the mounting state in which solder connections and so on are used.

Further, regarding the characteristics of the wiring patterns 410 on the boards 100, on which electronic parts such as IC, LSI and so on are mounted, there is a problem that the characteristic of the wiring pattern 410 in design is different from that of the wiring pattern 410 on the board 100 actually manufactured with respect to transmission of a high frequency signal or a high speed pulse signal, due to the fact that widths of wire lines, sizes and depths of through holes, thicknesses of multi-layered structures and so on are different from each other in accuracy every makers for manufacturing the boards 100.

The present invention have been made to solve the above-mentioned problems, and has an object to provide a wiring pattern characteristic evaluation mounting board in which a characteristic of a wiring pattern on a board with respect to a high frequency signal or a high speed pulse signal can be previously evaluated in substantially the same state as that of a mass-production board on which IC chips are mounted, at a pre-stage prior to manufacturing of mass-production boards.

Means for Solving the Problems

A wiring pattern characteristic evaluation mounting board according to the present invention is to evaluate characteristics of a wiring pattern including at least one of a wire line, a through hole, a passive element and so on formed over a board on which electronic parts are mounted, and comprises: a test pattern formed on said board, and defined as an element pattern which is at least one of said various wiring patterns; and a testing IC chip mounted on said board, and outputting a test signal having high frequency pulses and/or high speed pulses to the test pattern, a detection signal detected from the test pattern based on the test signal concerned being input to said testing IC chip, wherein said testing IC chip outputs the detection signal and/or a test result based on the detection signal to an external to said board as low frequency pulses and/or low speed pulses.

Like this, according to the present invention, since the test pattern defined as the element pattern which is one of the various wiring patterns, and the testing IC chip detecting the detection signal by transmitting the high frequency signal or the high speed pulse signal to the test pattern are arranged on the board, and since the testing IC chip is configured so as to output the detection signal and/or the test result based on the detection signal to the external to the board, it is possible to detect an concrete production accuracy of the wiring pattern as digital data with respect to the high frequency signal or the high speed pulse signal, whereby a characteristic evaluation of the wiring pattern on the board can be high accurately and easily carried out in the board itself under the same conditions as those in the mounting state of the mass-production board. Especially, since the inputting and outputting of the high frequency signal or the high speed pulse signal is carried out only between the testing IC chip mounted on the board and the test pattern, and since the transmission of the low frequency signal or the low speed pulse signal is carried out between the testing IC chip and the external, it is possible to evaluate the characteristic of the wiring pattern in such manner that occurrence of signal losses and noises can be suppressed as much as possible, and thus evaluation results can be output.

Also, in the wiring pattern characteristic evaluation mounting board according to the present invention, if necessary, the element pattern of the test pattern is emphasized and configured so as to have a larger routing length than that of a wire line in a mass-production wiring pattern formed on a board manufactured in mass production, and a larger number of through holes and passive elements than those of the mass-production board.

Like this, according to the present invention, since each of the element patterns of the test pattern are redundantly formed in comparison with the mass-production wiring pattern on the pass-production board actually manufactured in mass production, it is possible to emphasize and detect the characteristic of the wiring pattern with respect to the high frequency signal or the high speed pulse signal due to the redundancy of each of the element patterns, and thus the characteristic of the wiring pattern can be more accurately evaluated.

Also, the wiring pattern characteristic evaluation mounting board according to the present invention, if necessary, the test pattern is formed so that a plurality of wire lines, a plurality of through holes and so on are adjacent to each other, respectively.

like this, according to the present invention, since the test pattern is formed and arranged so that the spaces between the wire lines, the spaces between the through holes, the spaces between the passive elements and so on becomes smaller, it is possible to detect even crosstalk in the element patterns which are close to each other, and thus the characteristic of the wiring pattern can be evaluated as a whole with respect to the high frequency signal or the high speed pulse signal.

Also, the wiring pattern characteristic evaluation mounting board according to the present invention, if necessary, since the testing IC chip includes a test signal generation means for generating one test signal or a plurality of test signals based on a test command signal from an external, an element pattern selection means for selecting any one of the elements patterns included in said test pattern, and for outputting the test signal to the selected element pattern concerned, and a memory means for storing a detection signal detected from the element pattern based on said test signal.

Like this, according to the present invention, since the testing IC chip is configured so that the one test signal or the plurality of test signals are generated by the test signal generation means based on the test command signal from the external, so that any one of the elements patterns included in said test pattern is selected, with the test signal being output by the element pattern selection means to the selected element pattern concerned, and so that the detection signal detected from the element pattern based on said test signal is stored by the memory means, it is possible to detect the characteristic of the wiring pattern in the board itself by only a power source for driving the testing IC chip and an inputting of the test command signal, and thus it is possible to more accurately carry out the evaluation of the wiring pattern with respect to the high frequency signal or the high speed pulse signal.

Also, the wiring pattern characteristic evaluation mounting board according to the present invention, if necessary, the testing IC chip includes a test pattern evaluation means for evaluating the test pattern based on the test signal and the detection signal. Like this, according to the present invention, since the testing IC chip includes the test pattern evaluation means for evaluating the test pattern based on the test signal and the detection signal, it is possible to detect the characteristic of the wiring pattern in the board itself by only a power source for driving the testing IC chip and an inputting of the test command signal, and thus it is possible to easily and quickly carry out the evaluation of the wiring pattern with respect to the high frequency signal or the high speed pulse signal.

Also, the wiring pattern characteristic evaluation mounting according to the present invention, if necessary, the testing IC chip detects a detection signal based on an element pattern except for the element pattern to which the test signal is input. Like this, according to the present invention, since the testing IC chip is configured so as to detect the detection signal based on the element pattern except for the element pattern to which the test signal is input, it is possible to evaluate an influence, such as crosstalk and so on, on the element pattern to which no test signal is input, as a whole of the wiring pattern.

Also, a wiring pattern characteristic evaluation mounting board according to the present invention is to evaluate characteristics of a wiring pattern including at least one of a wire line, a through hole, a passive element and so on formed over a board on which electronic parts are mounted, and comprises: a test pattern formed on said board, and defined as an element pattern which is at least one of said various wiring patterns; an IC chip to be tested mounted said board, and outputting a test signal having high frequency pulses and/or high speed pulses to the test pattern; a signal detection section for detecting signals transmitting and receiving between said IC chip to be tested and said test pattern; and a testing IC chip to which a detection signal detected in said signal detection section is input, wherein said testing IC chip outputs the detection signal and/or a test result based on the detection signal to an external to said board as low frequency pulses and/or low speed pulses.

Like this, according to the present invention, since the test pattern defined as the element pattern which is at least one of the various wiring patterns, the IC chip to be tested outputting the test signal having the high frequency pulses and/or the high speed pulses to the test pattern, the signal detection section for detecting signals transmitting and receiving between the IC chip to be tested and the test pattern, and the testing IC chip to which a detection signal detected in said signal detection section is input are arranged on the board, and since the testing IC chip is configured so as to output the detection signal and/or the test result based on the detection signal to the external to the board as the low frequency pulses and/or the low speed pulses, it is possible for the testing IC chip to directly detect a wave shape of the signal, especially the high speed pulse signal or the high frequency signal, which is transmitted and received between the testing IC chip and the IC chip to be tested, and which is propagated in the wire line, and thus it is possible to detect surely and accurately an inherent characteristic of the wiring pattern without being subjected to influences of signal losses and noises occurring in contact locations and so on.

THE BEST MODE FOR EMBODYING THE INVENTION

First Embodiment of the Invention

Figure 1:
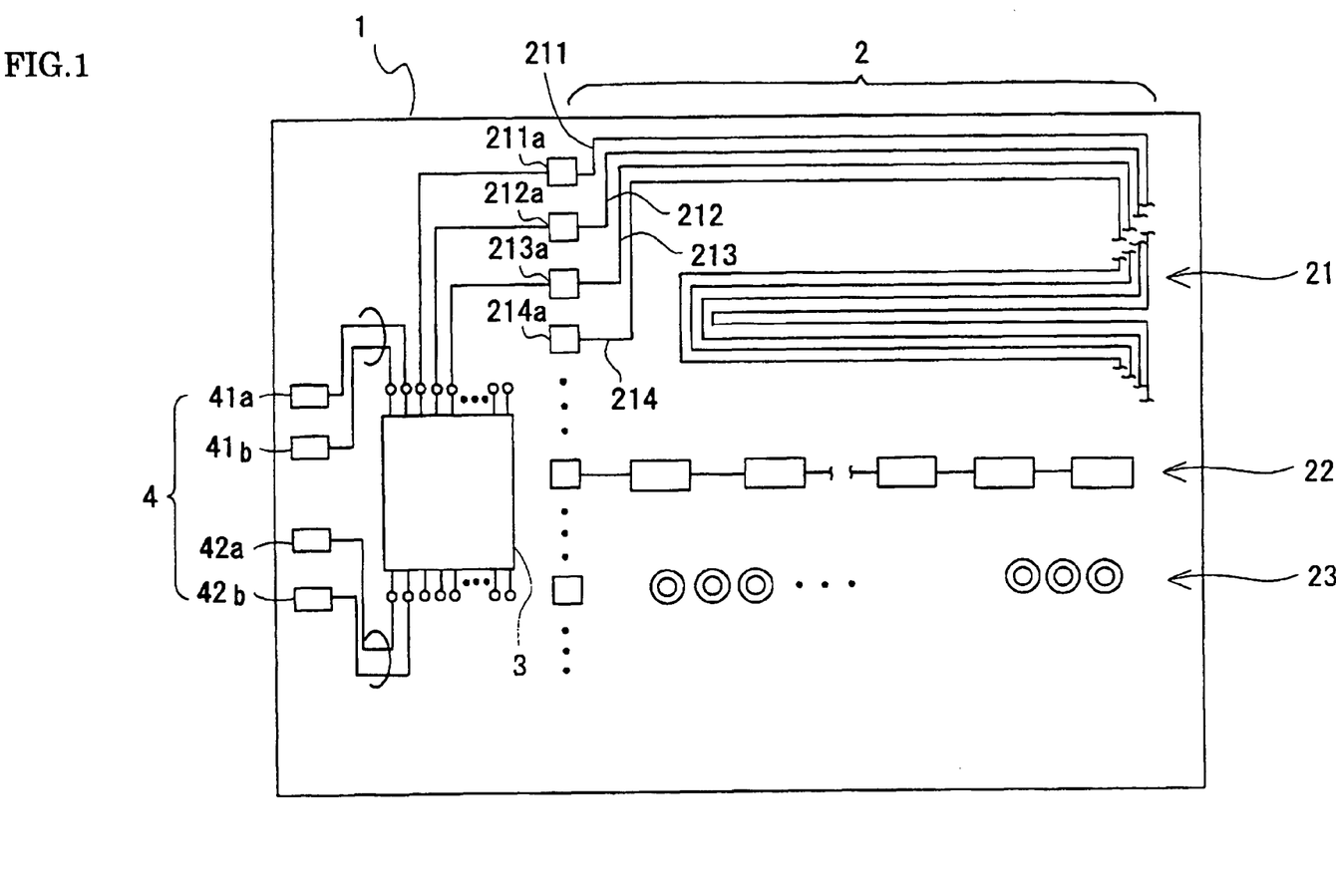
[FIG. 1] is a general schematic structural view of a wiring pattern characteristic evaluation mounting board according to a first embodiment of the present embodiment.
Figure 2:
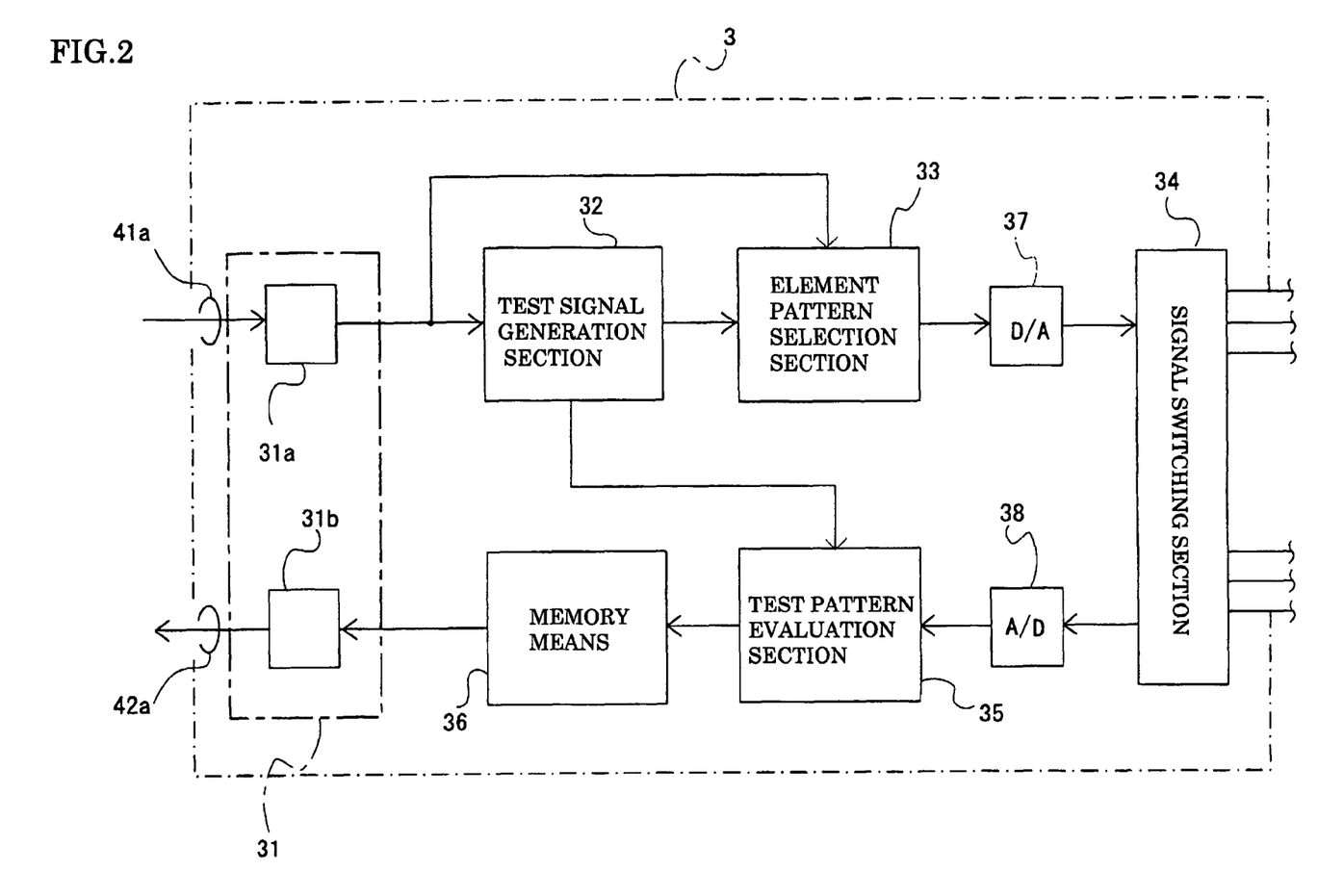
[FIG. 2] is a circuit block diagram of a testing IC chip on the wiring pattern characteristic evaluation mounting board of FIG. 1.

A wiring pattern characteristic evaluation mounting board according to a first embodiment according to the present invention will now be explained based on FIGS. 1 and 2 below. FIG. 1 is a general schematic structural view of the wiring pattern characteristic evaluation mounting board according to the present embodiment, and FIG. 2 is a circuit block diagram of a testing IC chip on the wiring pattern characteristic evaluation mounting board of FIG. 1.

In each of the aforesaid drawings, the wiring pattern characteristic evaluation mounting board according to the present embodiment is a structure including: a board main body 1 formed of a rectangular insulating plate member; a test pattern 2 formed on the board main body 1 and including element patterns 21, 22 and 23 which are defined as wiring patterns such as wire line patterns, through hole patterns, passive element patterns and so on; a testing IC chip 3, mounted on the board main body 1, which outputs test signals, having high frequency and high speed pulses, to the test pattern 2, to which detection signals, detected from the test pattern 2 based on the test signals, are input, and which calculates test results based on the detection signals and the test signals; and input/output terminals 4 through which the test results are output as low frequency slow speed pulses by the testing IC chip 3 to an external of the aforesaid board main body 1, and through which a drive power is fed to the testing IC chip 3.

The aforesaid testing IC chip 3 is a structure including: an input/output section 31 through which an input and an output are carried out; a test signal generation section 32 in which a plurality of test signals are generated based on a test command signal input from the input/output section 31; an element pattern selection section 33 in which an element pattern 21 (or 22, 23, . . . ) is selected from the test pattern 2, and which outputs test signals to the selected element pattern 21; a signal switching section 34 by which the test signals and detection signals to the selected element patterns are switched so as to be output and input; a test pattern evaluation section 35 which evaluates the test pattern based on the test signals and the detection signals; and a memory means 36 which stores evaluation results of the test pattern evaluation section 35.

There is provided a D/A converter 37 between the aforesaid element pattern selection section 33 and the aforesaid signal switching section 34, and the D/A converter 37 is configured so that an ID code of the selected element pattern 21 (or 22, 23, . . . ) selected in the element pattern selection section 33 and the test signals generated as digital signals in the test signal generation section 32 are converted into analog signals, and so that the analog signals are output to the board main body 1 through the signal switching section 34. Also, there is provided an A/D converter 38 between the aforesaid test pattern evaluation section 35 and the aforesaid signal switching section 24, and the A/D converter 38 is configured so that the detection signals output as analog signals from the element pattern 21 (or 22, 23, . . . ) on the board main body 1 through the signal switching section 24 are converted into digital signals, and so that the digital signals are input to the test pattern evaluation section 35.

The aforesaid board main body 1 may comprise a print wiring board, a ceramic wiring board, a multi-layered wiring print board, a multi-layered ceramic wiring board and so on. The test pattern 2 is configured so that the wiring patterns, the through hole patterns and the passive element patterns forming the element patterns 21, 22, 23, . . . are redundantly formed previously-set times with respect to mass-production wiring patterns formed on a board (referred to as a mass-production board hereinafter) manufactured in mass-production.

In the element pattern 21, wire lines in the wiring pattern are formed so that a routing length thereof has a given magnification. The wiring pattern of the wire lines is configured so that the wire lines are arranged in parallel or are layered with each other, spaces between the parallel-arranged wire lines or spaces between the layered wire lines being equivalent to those used in the aforesaid mass-production board. Also, the wiring pattern are configured so as to have loop-like closed circuits in which both the ends of the respective wire lines are connected to the signal switching section 34 and/or circuits in which each of the wire lines is connected at one end to the signal switching section and is opened at the other end.

The element patterns 22, 23 are formed so that a number of through holes, which is predetermined times a set number, are connected to each other in series or in parallel, and so that a number of passive elements, which is predetermined times a set number, are connected to each other in series or in parallel. The wiring pattern of the wiring through holes and the wiring pattern of the passive elements are configured so that the through holes are arranged in parallel or are layered with each other, and so that the passive elements are arranged in parallel or are layered with each other, similar to the aforesaid wire lines, spaces between the parallel-arranged through holes and spaces between the parallel-arranged passive elements or spaces between the layered through holes and spaces between the layered passive elements being equivalent to those used in the mass-production board.

The aforesaid testing IC chip 3 is configured so as to be connected in the same connecting manner (which is used in the mass-production board) as active elements of IC chips and so on mounted on the mass-production board are connected, for example, in a wire-bonding manner, a flip-chip manner, a dome lead manner, a tape-carrier manner and so on.

Next, a characteristic evaluation operation of the wiring pattern characteristic evaluation mounting board based the above-mentioned arrangement according to the present embodiment is explained. It is supposed that the wiring pattern characteristic evaluation mounting board according to the present embodiment is manufactured in the same manner as a mass-production board, on which wiring patterns are formed, and on which the various function elements are mounted, is manufactured by a maker. In a design stage prior to manufacture of mass-production boards in mass production, by the maker, designed wiring patterns and mounting characteristics are previously evaluated, using the wiring pattern characteristic evaluation mounting board according to the present embodiment.

First, while a drive power is fed from power terminals 41*b*, 42*b* of the input/output terminals 4 to the testing IC chip 3, a testing command signal having low speed pulses (or low frequency) is input from an input terminal 41*a* to the testing IC chip 3.

The input testing command signal is input to the test signal generation section 32 through an input terminal 31*a* of the input/output section 31, the test signal generation section 32 generates a testing signal having high frequency and high speed pluses based on the testing command signal having the aforesaid low pulse (or low frequency), and it is output to the element pattern selection section 33 together element pattern specifying data included in the testing command signal.

The element pattern selection section 33 selects any one of the element patterns 21, 22, 23, . . . based on the input element pattern specifying data, generates a selection signal corresponding to the selected element pattern, and outputs the testing signal together with the selection signal. After the selection signal and the testing signal are converted into analog signals by the D/A converter 37, they are input to the signal switching section 34, and the selection signal switches an internal switch of the signal switching section 34, so that the testing signal, as shown in, for example, FIGS. 4(A) to 4(C), is input as an input signal to a wire line 211 of the element pattern 21 through a pad 211a.

The wire line 211 is formed as a wiring pattern bent into a generally rectangular shape, and terminates at an open end, with the wire line 211 is arranged in parallel with other wire lines 212, 213, 214, . . . at a given interval. A characteristic impedance of the wire line 211 propagating the testing signal is altered due to characteristics of the wire line itself, reflection conditions at the open end of the wire line, influences by the adjacent wire lines 212, 213, 214, . . . , and so on, and the altered testing signal is reflected and output from the aforesaid input terminal 42a as a detection signal having high frequency and high speed pulses (for example, input signals as shown in FIGS. 4(A) to 4(C)).

Figure 4A:
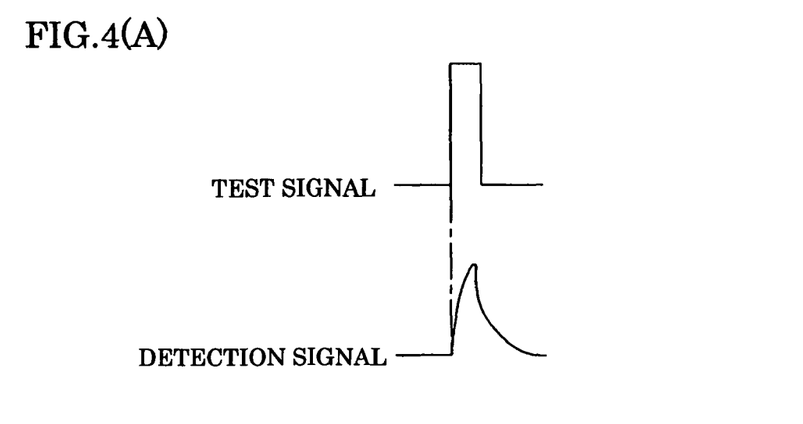
[FIG. 4] is wave-shape views of input signals and detection signals of a wiring pattern characteristic evaluation mounting board according to another embodiment of the present invention.
Figure 4B:
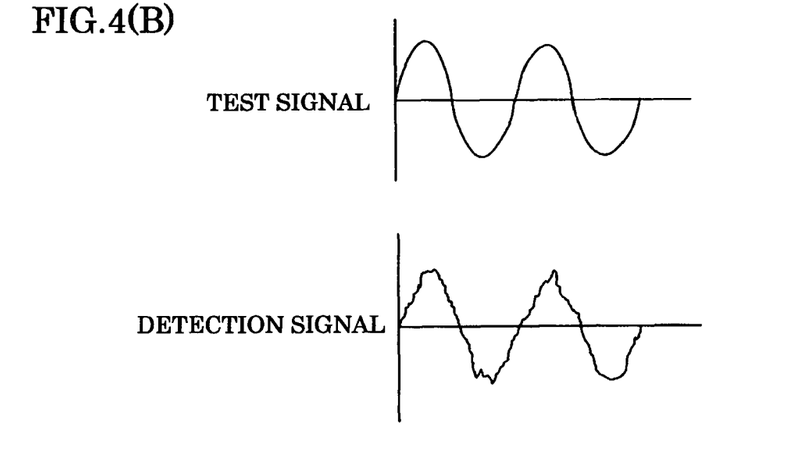
Figure 4C:
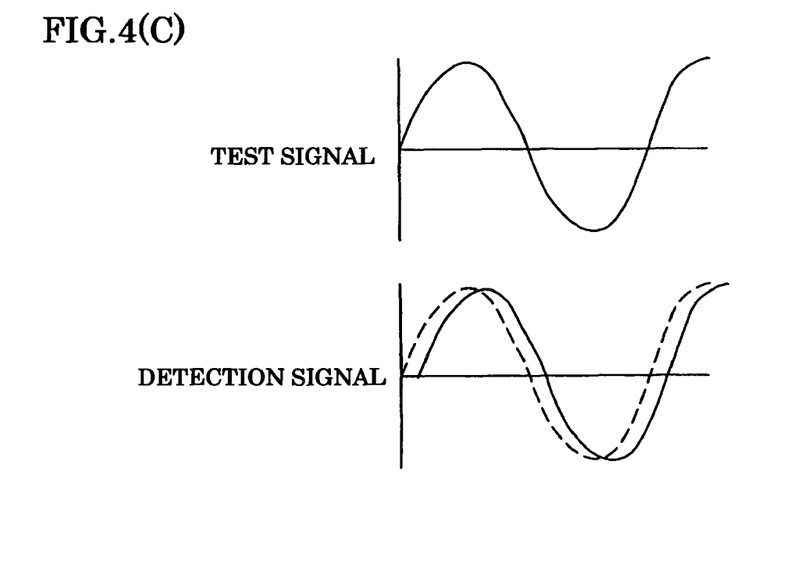

In FIG. 4(A), when a high frequency signal having a rectangular wave is input as an input signal, it becomes a high frequency detection signal, a wave shape of which is transformed due to impedance of the wire line 211 and the adjacent wire line 212 and so on. Also, in FIG. 4(B), when a high frequency signal having a sine wave is input as an input signal, it becomes a high frequency detection signal, a wave shape of which is distorted due to noises and losses involved in the wire line 211. Also, in FIG. 4(C), when a high frequency signal having a sine wave is input as an input signal, it becomes a high frequency detection signal, a phase of which is shifted due to impedance of the wire line 211 and the adjacent wire line 212 and so on.

Such a detection signal is input to the test pattern evaluation section 35 through the A/D converter 38, and the test pattern evaluation section 35 carries out a characteristic evaluation to the high frequency and high speed pulse signal in the wire line 211 on the board main body 1, based on the detection signal and the original testing signal therefor, and then outputs evaluation result data to the memory means 36. The memory means 36 stores and holds in turn the aforesaid evaluation result data as digital data, and the aforesaid held evaluation data is output as a low speed (or frequency) signal from an output terminal 42a of the input/output terminal 4 to an external control section (not shown) based on an output command from the external control section.

Also, with respect to the other wire lines 112, 113, . . . of the test pattern 2 and the element patterns 22, 23, characteristic evaluations are carried out, similar to the case of the wire lines 211, evaluation results are stored in turn by the memory means 36, and the stored evaluation data is output as a low speed (or low frequency) signal to the external control section, whereby the characteristics of the wiring patterns can be previously detected before mass-production boards are manufactured in mass-production.

Other Embodiments of the Invention

Figure 3:
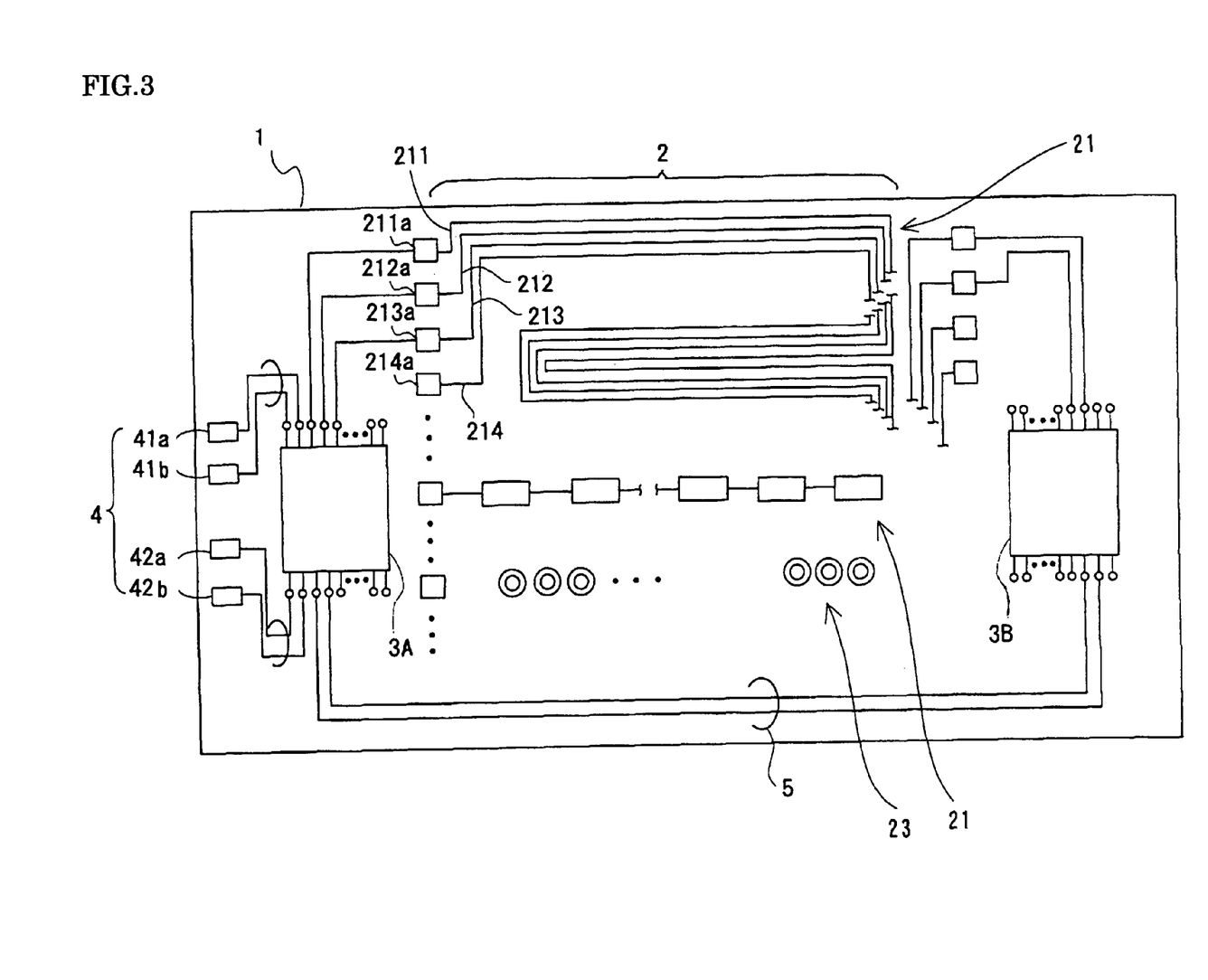
[FIG. 3] is a general schematic structural view of a wiring pattern characteristic evaluation mounting board according to another embodiment of the present invention.

FIG. 3 shows a general schematic structural view of a wiring pattern characteristic evaluation mounting board according to another embodiment of the present invention. In this drawing, similar to the above-mentioned first embodiment, the wiring pattern characteristic evaluation mounting board according to the present embodiment includes a board main body 1, a test pattern 2, a testing IC chip 3 and an input/output terminal 4, and the testing IC chip 3 includes a first testing IC chip 3A and a second testing IC chip 3B. While the test pattern 2 establishes a connection between the first testing IC chip 3A and the second testing IC chip 3B, the first testing IC chip 3A and the second testing IC chip 3B are connected to each other by signal lines 5 so that transmitting and receiving of a synchronization signal and a detection signal are carried out.

Both the first testing IC chip 3A and the second testing IC chip 3B are configured so that any one of elements patterns 21, 22, 23, . . . included in the test pattern 2 is selected to specify the wire line 211, 212, 213, . . . , and so that a test signal having high frequency and high speed pulses is oscillated and output to the specified object to be tested to carry out a characteristic evaluation of the object to be tested by a detection signal based on the test signal. The first testing IC chip 3A and the second testing IC chip 3B may input test signals to the adjacent different element patterns 21, 22, 23. In this case, crosstalk, EMI and so on caused by the respective test signals between the adjacent element patterns 21, 22, 23 are detected to thereby carry out characteristic evaluations.

In the characteristic evaluations, the first testing IC chip 3A and the second testing IC chip 3B seek a wave-shaped eye pattern from both a wave-shape of the test signal and a wave-shape of the detection signal, and then seek and evaluate a phase difference and an amplitude difference based on the eye pattern. Also, each of the test signal and the detection signal is subjected to an A/D conversion, and a comparison is made at the digital values, whereby the characteristic evaluation can be carried out.

Figure 5:
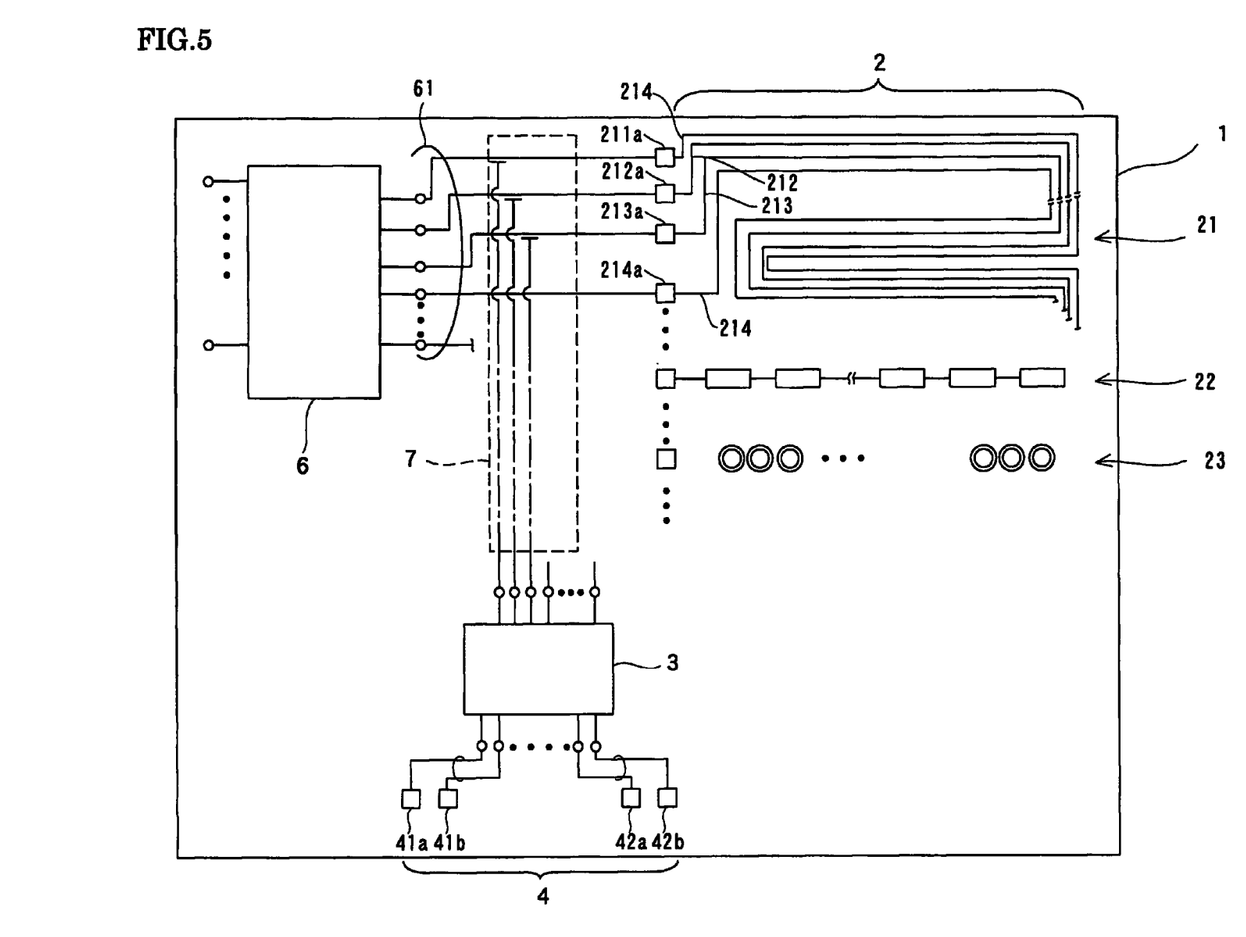
[FIG. 5] is a general schematic structural view of a wiring pattern characteristic evaluation mounting board according to another embodiment of the present invention.

FIG. 5 shows a general schematic structural view of a wiring pattern characteristic evaluation mounting board according to another embodiment of the present invention. In this drawing, similar to the above-mentioned first embodiment, the wiring pattern characteristic evaluation mounting board according to the present embodiment includes a board main body 1, a test pattern 2, a testing IC chip 3 and an input/output terminal 4. In addition to this arrangement, the wiring pattern characteristic evaluation mounting board further includes an IC chip 6 to be tested which outputs signals to the aforesaid test pattern 2, and a signal detection section 7 which detects signals transmitting and receiving between the IC chip 6 to be tested and the test pattern 2, and which inputs the detected signals to the aforesaid testing IC chip 3.

The aforesaid IC chip 6 to be tested is configured so that the signals to be output to the test pattern 2 are output based on a previously programmed operation procedure, so that the signals are output based on control signals input from the testing IC chip 3 through not shown wire lines, or so that the signals are output based on direct control signals from an external. Also, the aforesaid signal detection section 7 is configured so as to detect signals propagating wire lines 61 which are connected to the respective element patterns 21 (or 22, 23) of the evaluation objects by electrical connection such as capacitance connections and so on, crosstalk connections in which wire lines are arranged to adjacent to each other, and so on.

Like this, a test signal is input from the IC chip 6 to be tested to the test pattern 2, and, based on this test signal $S_1$, a wave transformation caused by impedance and so on of the test pattern 2 is detected as a detection signal by the testing IC chip 3. Since the testing IC chip 3 can directly detects a wave-shape of a signal, especially a high speed pulse signal or a high frequency signal, propagating the wire lines 61, which are transmitted and received between the IC chip to be tested 6 and the test pattern 2, it is possible to surely and correctly detect an inherent characteristic of the wiring pattern without being subjected to signal loss, resulting from contact locations and so on at input/output, and noise influence.

Figure 6A:
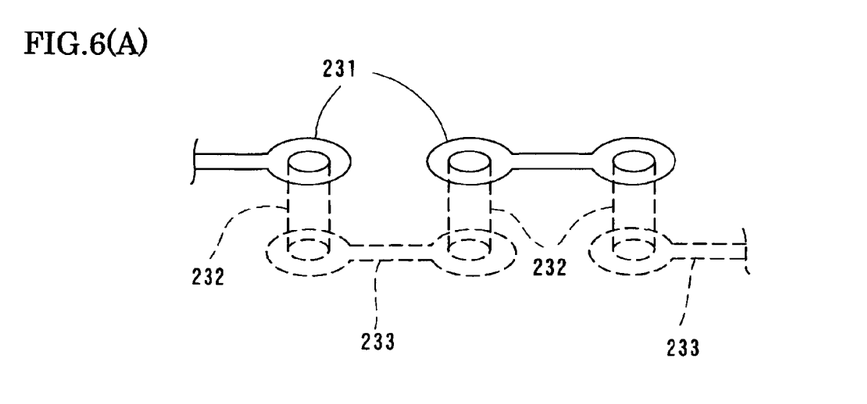
[FIG. 6] is a detailed perspective view of through holes shown in FIGS. 1 and 3, and a cross-sectional view of a wiring pattern characteristic evaluation mounting board according to another embodiment of the present invention.

Note, FIG. 6(A) is a detailed perspective view of through holes (or vias) shown in FIGS. 1 and 3. In this drawing, the through holes, which are formed in the wiring pattern characteristic evaluation mounting board according to the present embodiment, are configured so that two adjacent consecutive vias 232 are connected to each other by a wire line 231 in an upper layer, and so that the vias 232 corresponding to the upper layer are connected to each other by a wire line 233 in a lower layer.

Figure 6B:
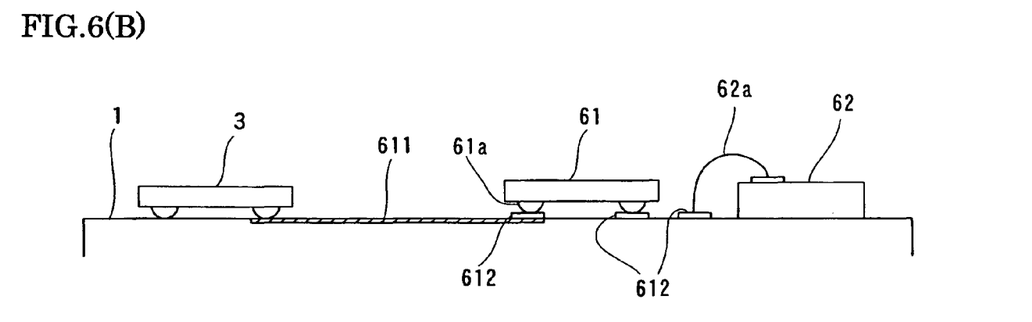

FIG. 6(B) is a cross-sectional view of a wiring pattern characteristic evaluation mounting board according to another embodiment of the present invention. In this drawing, a test signal is input from a testing IC chip 3 to IC chips 61, 62 to be tested through a wire line 611. When the test signal is input to the IC chip 61 to be tested, a signal attenuation and a signal noise, caused between a pad 612 and a ball 61a, are detected as detection signals by the testing IC chip 3. Also, the test signal is input to the aforesaid IC chip 62 to be tested, a signal attenuation and a signal noise, caused at a gold wire 62a connected to a pad 612 by a wire bonding, are detected as detection signals by the testing IC chip 3.

Like this, in the characteristic evaluation, a phase difference $\Delta_t$ is measured from a wave-shape of the test signal and a wave-shape of the detection signal, and, based on the phase difference $\Delta_t$, the characteristics to the high frequency of the testing object, which result from attenuation, reflection, crosstalk, EMI (Electromagnetic Interference) of the test signal, a material of the board 100, a material of the pattern metal, interference on insulating interlayers and so on, are detected.

(Concrete Operational Testing)

Next, as testing operations on the above-mentioned embodiments, a TDR (Time Domain Reflectmetry) method and a high frequency characteristic testing method based on an S (Scattering) parameter are explained below.

Figure 7:
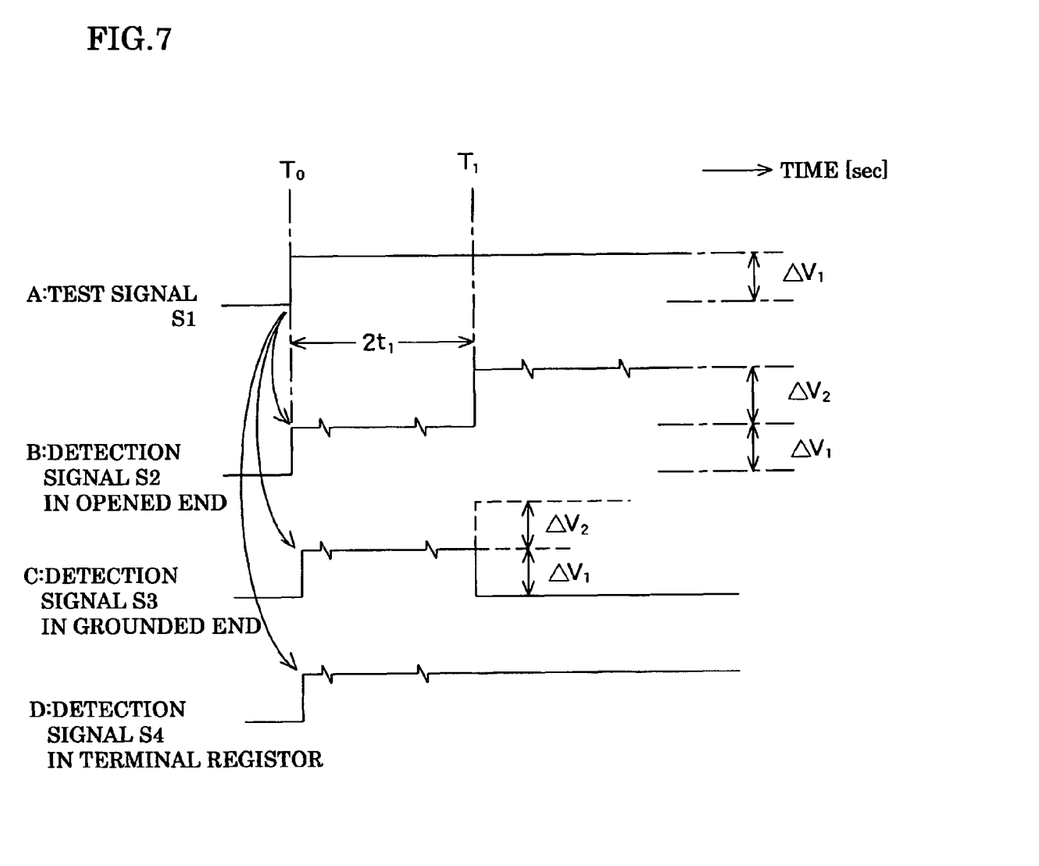
[FIG. 7] is a timing chart of test signals and detection signals used in a testing operation according to the TDR method in one embodiment of the present invention.

FIG. 7 shows a timing chart of test signals and detection signals used in a testing operation according to the TDR method in one embodiment of the present invention. In this drawing, a test signal $S_1$ is formed as a step signal having high speed pulses involving a high speed switching operation in which a rise time is on the order of 20-50 ps. In the wiring pattern characteristic evaluation mounting board shown in the aforesaid FIG. 1 or 3, the test signal $S_1$ is input from the testing IC chip 3 to the element pattern 21 (or 22, 23) of the test pattern 2.

First, when the element pattern 21 (or 22, 23) terminates at an opened end, the test signal $S_1$, which is input to the element pattern 21 (or 22, 23), is subjected to a wave-transformation due to the impedance and the routing state of the element pattern 21 (or 22, 23), and is reflected as the same phase one at the opened end (not shown), and then is detected as a detection signal $S_2$ having a high speed wave-shape as shown in FIG. 7(B). The test signal $S_1$ is reflected as the same phase one at the aforesaid opened end at a time $T_1$ after a time $2t_1$ (sec), which is measured from an inputting time $T_0$ of the test signal $S_1$ until the test signal $S_1$ goes there and back along the wire line of the element pattern 21 (or 22, 23), has elapsed, and the detection signal $S_2$ shown in FIG. 7(B) is output as one having a voltage resulting from an addition of a voltage $\Delta V_1$ of the test signal and a voltage $\Delta V_2$ of the reflected signal.

Also, when the element pattern 21 (or 22, 23) terminates at a grounded end, similar to the case of the aforesaid opened end, the test signal $S_1$, which is input to the element pattern 21 (or 22, 23), is subjected to a wave-transformation due to the impedance and the routing state of the element pattern 21 (or 22, 23), but the test signal $S_1$ is reflected as the reverse phase one at the grounded end (not shown), and then is detected as a detection signal $S_3$ having a high speed wave-shape as shown in FIG. 7(C). The test signal $S_1$ is reflected as the reverse phase one at the aforesaid grounded end at a time $T_1$ after a time $2t_i$ (sec), which is measured from an inputting time $T_0$ of the test signal $S_1$ until the test signal $S_1$ goes there and back along the wire line of the element pattern 21 (or 22, 23), has elapsed, and the detection signal $S_3$ shown in FIG. 7(C) is output as one having a "0" voltage resulting from a cancellation of a voltage $\Delta V_1$ of the test signal and a voltage $\Delta V_2$ ($\Delta V_1 = \Delta V_2$) of the reflected signal.

Also, when the terminal end of the aforesaid element pattern 21 (or 22, 23) is connected to a terminal resistor, similar to the cases of the aforesaid opened end and the aforesaid grounded end, the test signal $S_1$, which is input to the element pattern 21 (or 22, 23), is subjected to a wave-transformation due to the impedance and the routing state of the element pattern 21 (or 22, 23), but the test signal $S_1$ is absorbed at the terminal end (not shown) to which the terminal resistor is connected, and then is detected as a detection signal $S_4$ having a high speed wave-shape as shown in FIG. 7(D).

In any one of the aforesaid cases, the detection signal $S_2$, $S_3$, $S_4$ is output from the element pattern 21 (or 22, 23) to the testing IC chip 3, and, in this testing IC chip 3, an evaluation of the element pattern 21 (or 22, 23) is carried out based on the high speed pulse wave-shape. The test results on this evaluation are output as low frequency pulses or low speed pulses from the testing IC chip 3 to an external.

Figure 8A:
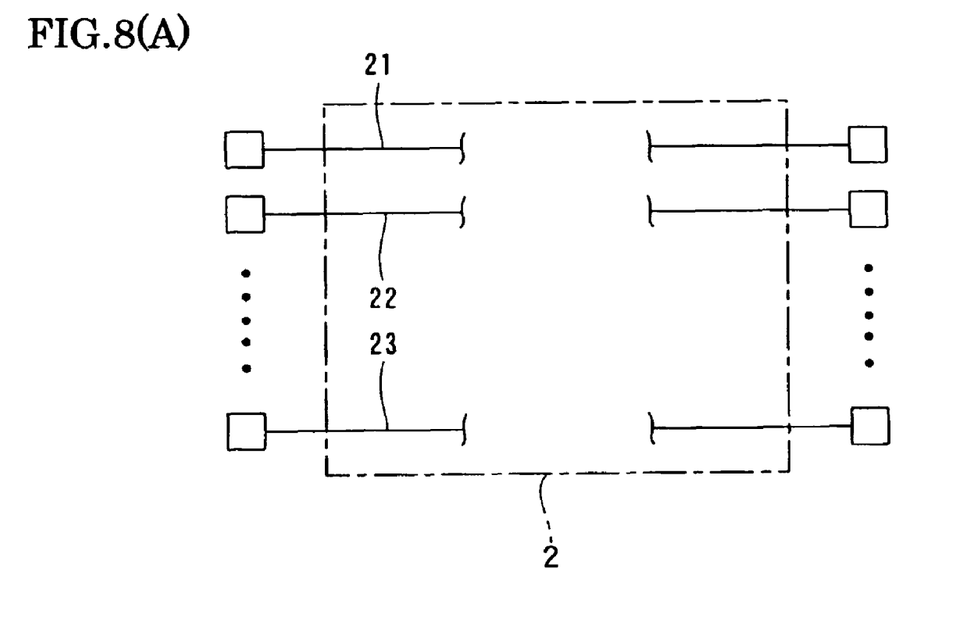
[FIG. 8] is an explanatory view for explaining a high frequency characteristic testing method based on an S parameter.
Figure 8B:
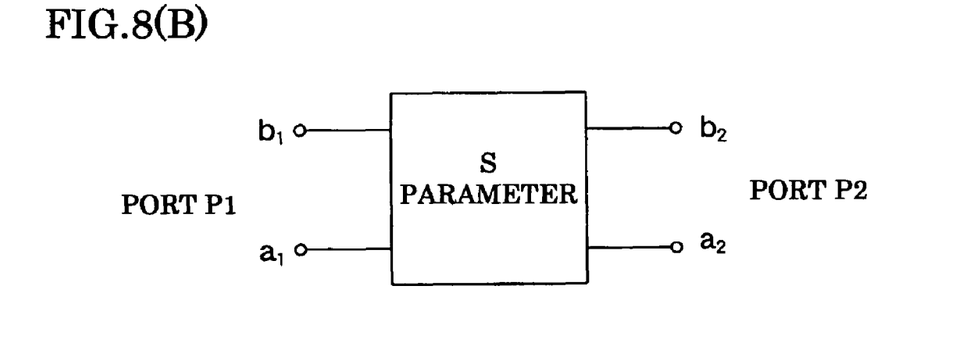

In the high frequency characteristic testing method based on the aforesaid S parameter, the element pattern 21 (or 22, 23) of the test pattern 2 is defined as an S parameter of a 2-port network, and a reflection factor, a transmission factor, an attenuation factor and a phase factor on the element pattern 21 (or 22, 23) are detected by an S parameter as shown in FIG. 8.

In the S parameter of FIG. 8, when the test signal $S_1$, which is input from a port $P_1$, is reflected to the port $P_1$ of the element pattern 21 (or 22, 23) itself, a reflection rate of the test signal $S_1$ is defined as $S_{11}$, and when the test signal $S_1$ is transmitted to a port $P_2$, a transmission rate of the test signal $S_1$ is defined as $S_{12}$. On the other hand, when the test signal $S_1$, which is input from the port $P_2$, is reflected to the port $P_2$ of the element pattern 21 (or 22, 23) itself, a reflection rate of the test signal $S_1$ is defined as $S_{22}$, and when the test signal $S_1$ is transmitted to the port $P_1$, a transmission rate of the test signal $S_1$ is defined as $S_{22}$.

Based on these relationships, the S parameter may be represented by the following equation:

$$\begin{matrix} b_1 \\ b_2 \end{matrix} = \begin{matrix} S_{11} & S_{12} \\ S_{22} & S_{21} \end{matrix} \begin{matrix} a_1 \\ a_2 \end{matrix} \qquad \text{[Expression 1]}$$

With the above-mentioned equation, it is possible to detect powers of incidence wave and reflection wave on the element pattern 21 (or 22, 23) by wave amplitudes ($a_1$, $a_2$, $b_1$, $b_2$) of a linear combination of current·voltage.

EXPLANATION OF REFERENCES

1 Board Main Body
21, 22, 23 Element Pattern
100 Board
2 Test Pattern
201 Probe
202 Test Signal Outputting Section
203 Measurement Apparatus Main Body
204
211a, 212a, 213a, . . . , 401 Pad
231, 232, 233
27 D/A Converter
28 A/D Converter
111,112, 113, . . . , 211, 212, 213 . . . Wiring Path
3, 3A, 3B Testing IC Chip
31 Input/Output Section
31a Input Terminal
31b Output Terminal
32 Test Signal Generation Section
33 Element Pattern Selection Section
34 Signal Switching Section
35 Test Pattern Evaluation Section
36 Memory Means
4 Input/Output Terminal
41a Input Terminal
41b, 42b Power Terminal
42a Output Terminal
410 Wiring Pattern
5 Signal Path
6 IC Chip to be Tested
61a Ball
612 Pad
7 Signal Detection Section

The invention claimed is:

1. A wiring pattern characteristic evaluation mounting board for evaluating characteristics of a wiring pattern including at least one of a wire line, a through hole, and a passive element formed over said board, said board comprising: a test pattern formed on said board, and defined as an element pattern which is at least one of said various wiring patterns; and a testing IC chip mounted on said board, said testing IC chip outputting a test signal having high frequency pulses and/or high speed pulses to the test pattern, and said testing IC chip detecting a detection signal inputted from the test pattern in response to the test signal outputted from said testing IC chip, wherein said testing IC chip outputs a test result signal based on the detection signal to an external control section as low frequency pulses and/or low speed pulses.

2. The wiring pattern characteristic evaluation mounting board as set forth in claim 1, wherein said test pattern is formed so that at least two of a plurality of wire lines, a plurality of through holes and a plurality of passive elements are adjacent to each other, respectively.

3. The wiring pattern characteristic evaluation mounting board as set forth in any one of claim 1, wherein said testing IC chip includes a test signal generation means for generating one test signal or a plurality of test signals based on a test command signal from an external control section, an element pattern selection means for selecting any one of the elements patterns included in said test pattern, and for outputting the test signal to the selected element pattern concerned, and a memory means for storing a detection signal detected from the element pattern based on said test signal.

4. The wiring pattern characteristic evaluation mounting board as set forth in claim 3, wherein said testing IC chip includes a test pattern evaluation means for evaluating the test pattern based on the test signal and the detection signal.

5. The wiring pattern characteristic evaluation mounting board as set forth in claim 3, wherein said testing IC chip detects a detection signal based on an element pattern except for the element pattern to which the test signal is input.

6. A wiring pattern characteristic evaluation mounting board for evaluating characteristics of a wiring pattern including at least one of a wire line, a through hole, and a passive element formed over said board, said board comprising: a test pattern formed on said board, and defined as an element pattern which is at least one of said various wiring patterns; an IC chip to be tested mounted on said board, and outputting a test signal having high frequency pulses and/or high speed pulses to the test pattern; a signal detection section for detecting signals transmitted and received between said IC chip to be tested and said test pattern; and a testing IC chip to receive a detection signal detected in said signal detection section, wherein said testing IC chip outputs a test result signal based on the detection signal to an external control section as low frequency pulses and/or low speed pulses.

* * * * *